US010394286B2

(12) United States Patent
Mao et al.

(10) Patent No.: US 10,394,286 B2
(45) Date of Patent: Aug. 27, 2019

(54) PORTABLE ELECTRONIC DEVICE

(71) Applicant: ASUSTeK COMPUTER INC., Taipei (TW)

(72) Inventors: Tzu-Jen Mao, Taipei (TW); Lian-Tien Ke, Taipei (TW); Chung-Jen Chung, Taipei (TW); Tsung-Ju Chiang, Taipei (TW); Yi-Chung Chiu, Taipei (TW); Wen-Ting Yu, Taipei (TW); Chi-Chao Hsu, Taipei (TW); Jui-Cheng Chien, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 16/155,619

(22) Filed: Oct. 9, 2018

(65) Prior Publication Data

US 2019/0121400 A1 Apr. 25, 2019

(30) Foreign Application Priority Data

Oct. 20, 2017 (TW) ................................ 106136268

(51) Int. Cl.

| | |
|---|---|
| ***G06F 1/16*** | (2006.01) |
| ***H05K 5/03*** | (2006.01) |
| ***H05K 7/14*** | (2006.01) |
| ***H05K 5/02*** | (2006.01) |

(52) U.S. Cl.

CPC ......... *G06F 1/1681* (2013.01); *H05K 5/0226* (2013.01); *H05K 5/0243* (2013.01); *H05K 5/03* (2013.01); *H05K 7/1401* (2013.01)

(58) Field of Classification Search

CPC combination set(s) only.
See application file for complete search history.

(56) References Cited

U.S. PATENT DOCUMENTS

| | | | | |
|---|---|---|---|---|
| 4,089,044 A * | 5/1978 | Gatto | .................. | H01M 2/1022 361/625 |
| 5,929,379 A * | 7/1999 | Reiner | ..................... | H05K 5/03 174/66 |

(Continued)

FOREIGN PATENT DOCUMENTS

| | | |
|---|---|---|
| CN | 102278574 | 12/2011 |
| TW | 201108916 A1 | 3/2011 |
| TW | I554707 B | 10/2016 |

*Primary Examiner* — Lisa Lea-Edmonds

(74) *Attorney, Agent, or Firm* — McClure, Qualey & Rodack, LLP

(57) ABSTRACT

The disclosure provides a portable electronic device, including a main body, a side cover, a decorative plate, and an elastic element. The side cover is pivotally disposed on a side edge of the main body. The side cover is movable between a first position and a second position relative to the main body. The side cover abuts against the main body when in the first position. The side cover forms an angle with the main body when in the second position. The decorative plate includes a first edge, a second edge, and a third edge. The first edge is pivotally disposed on the side cover. The second edge abuts against the main body when the side cover is in the first position. The second edge is separate from the main body and the third edge abuts against the main body when the side cover is in the second position. The elastic element is disposed at the second edge. The elastic element supports the decorative plate when the side cover is in the second position.

10 Claims, 14 Drawing Sheets

(56) References Cited

U.S. PATENT DOCUMENTS

| | | | | |
|---|---|---|---|---|
| 6,373,690 | B1 * | 4/2002 | Buican | G06F 1/181 16/223 |
| 6,381,138 | B1 * | 4/2002 | Chen | G06F 1/181 312/223.2 |
| 6,757,159 | B2 * | 6/2004 | Zarek | G06F 1/1616 108/43 |
| 7,016,184 | B1 * | 3/2006 | Oneyama | G06F 1/1616 248/551 |
| 7,248,463 | B2 * | 7/2007 | Bander | G06F 1/1607 361/679.27 |
| 7,604,305 | B2 * | 10/2009 | Chen | G06F 1/183 312/223.2 |
| 7,760,494 | B2 * | 7/2010 | Policar | F16M 11/22 248/918 |
| 8,246,001 | B2 | 8/2012 | Huang | |
| 8,976,514 | B2 * | 3/2015 | Chen | G06F 1/182 361/679.02 |
| 9,036,347 | B2 * | 5/2015 | Kuo | F16M 11/10 361/679.59 |
| 9,383,780 | B2 * | 7/2016 | Tsukahara | G06F 1/1643 |
| 9,864,416 | B2 * | 1/2018 | Liang | G06F 1/1626 |
| 9,891,664 | B2 * | 2/2018 | Kim | G06F 1/1626 |
| 2008/0074834 | A1 * | 3/2008 | Chien | G06F 1/1601 361/679.55 |
| 2009/0316350 | A1 * | 12/2009 | Hu | H05K 5/03 361/679.33 |
| 2013/0229774 | A1 * | 9/2013 | Chen | H05K 7/20136 361/695 |

* cited by examiner

PORTABLE ELECTRONIC DEVICE

CROSS-REFERENCE TO RELATED APPLICATION

This application claims the priority benefit of Taiwan application serial No. 106136268, filed on Oct. 20, 2017. The entirety of the above-mentioned patent application is hereby incorporated by reference herein and made a part of the specification.

BACKGROUND OF THE INVENTION

Field of the Invention

The invention relates to an electronic device, and in particular, to a portable electronic device.

Description of the Related Art

With the increasing popularity of electronic devices, various forms of electronic devices are used in people's daily life. To reduce the space occupied by electronic devices, the electronic devices with structures for upright position are developed. However, to archive upright position, there are usually configured with an additional supporter assembling to the body of the electronic device. However, the stability of the electronic device within the additional supporter in the upright position is not ensured since users' using behaviors are various. In addition, in order to correctly use the additional supporter, users need to read corresponding user instructions for the first time, which is not intuition.

BRIEF SUMMARY OF THE INVENTION

The disclosure provides a portable electronic device, including a main body, a side cover, a decorative plate, and an elastic element. The side cover is pivotally disposed on a side edge of the main body. The side cover is movable between a first position and a second position relative to the main body. The side cover abuts against the main body when in the first position. The side cover forms an angle with the main body when in the second position. The decorative plate includes a first edge, a second edge, and a third edge. The first edge is pivotally disposed on the side cover. The second edge abuts against the main body when the side cover is in the first position. The second edge is separated from the main body and the third edge abuts against the main body when the side cover is in the second position. The elastic element is disposed at the second edge. The elastic element supports the decorative plate when the side cover is in the second position.

Based on the above, only two side covers pivotally connected to the main body are opened when the portable electronic device of the disclosure is used in upright position. After being opened, the two side covers are stably disposed at a predetermined angle to stably support the main body, and the decorative plate between the side cover and the main body is opened along with the side cover to enhance the stability of the side cover. In this way, the portable electronic device is stably supported through simple operations when used in upright position.

DETAILED DESCRIPTION OF THE EMBODIMENTS

Figure 1:
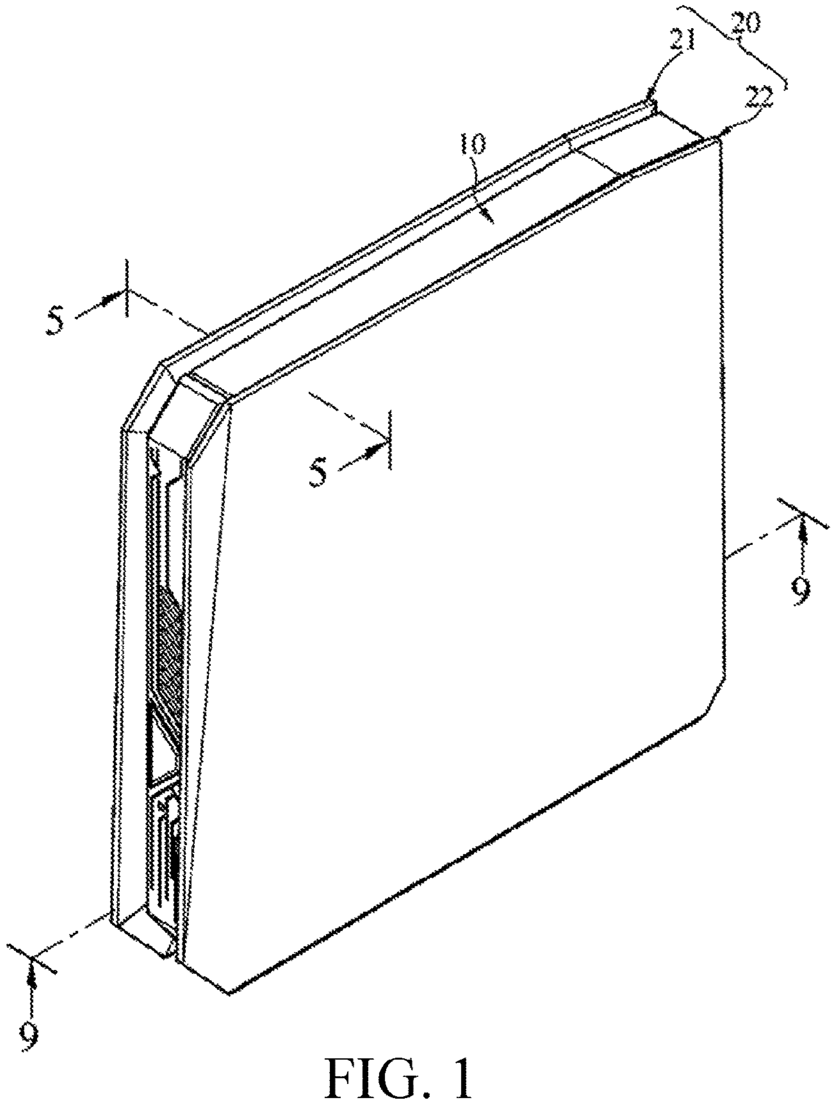
FIG. 1 is a three-dimensional outside view of an embodiment of a portable electronic device in a first position according to the invention.
Figure 2:
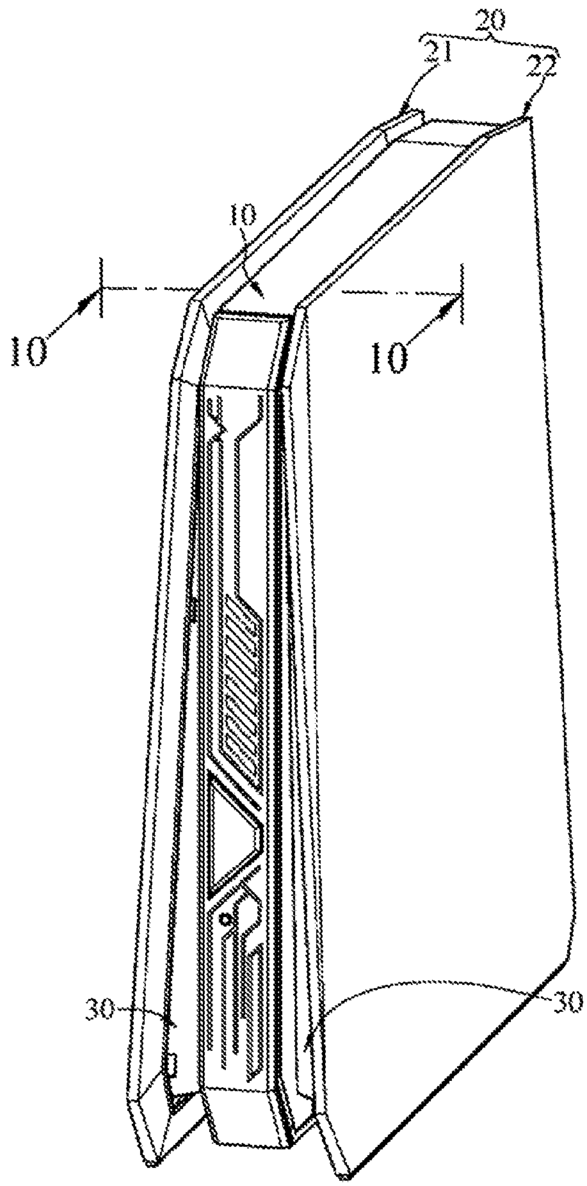
FIG. 2 is a three-dimensional outside view of an embodiment of a portable electronic device in a second position according to the invention.

Referring to FIG. 1 and FIG. 2, FIG. 1 is a three-dimensional outside view of an embodiment of a portable electronic device in a first position according to the invention, and FIG. 2 is a three-dimensional outside view of an embodiment of a portable electronic device in a second position according to the invention.

Figure 3:
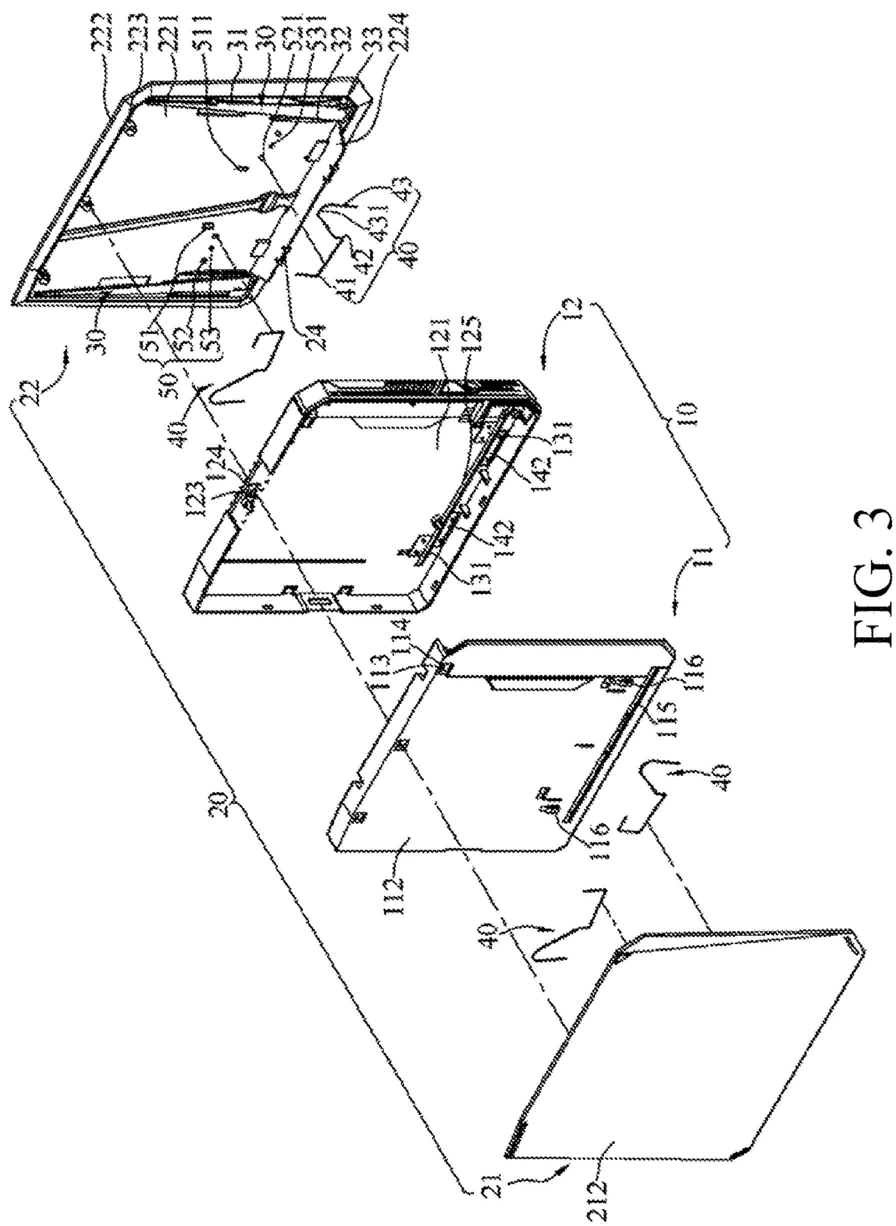
FIG. 3 is a three-dimensional structural exploded view of an embodiment of a portable electronic device according to the invention.
Figure 4:
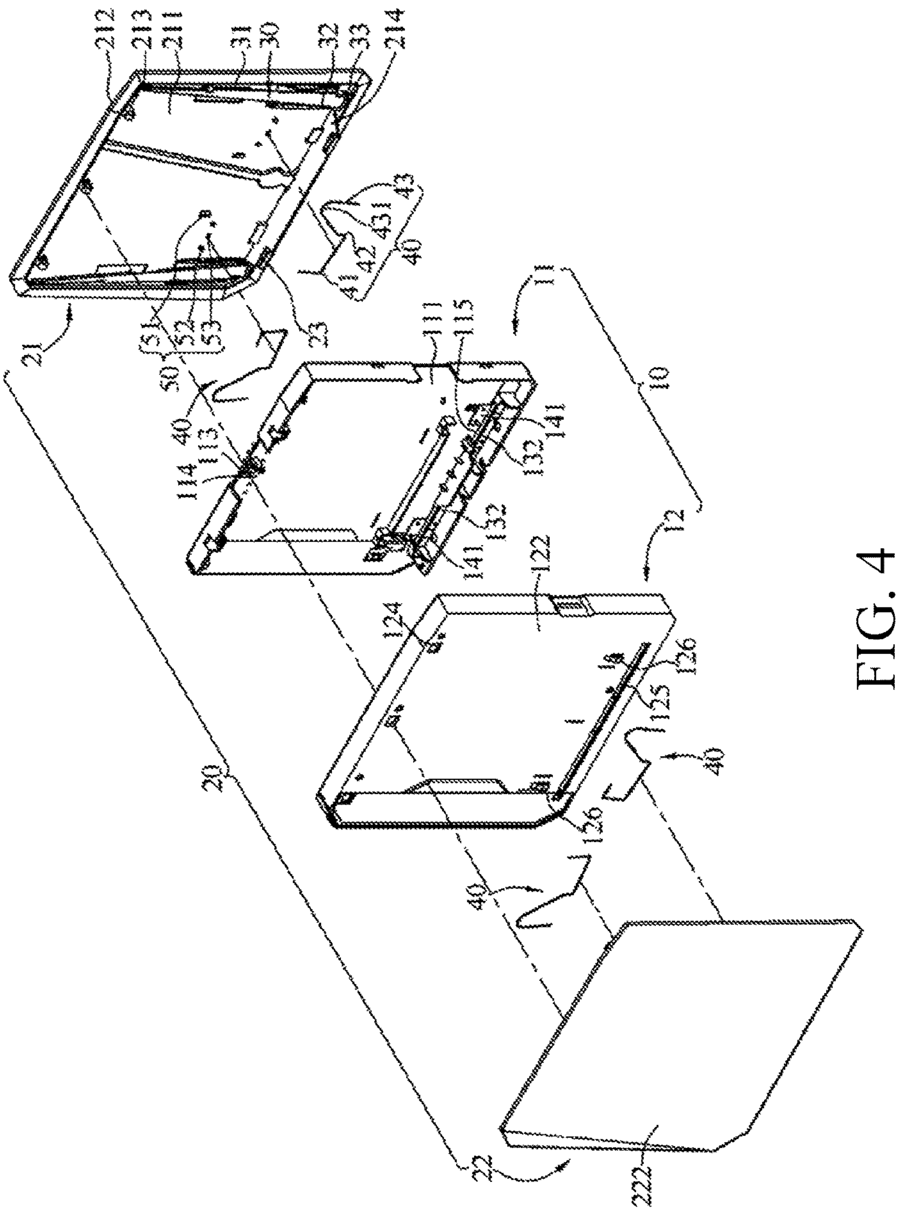
FIG. 4 is a three-dimensional structural exploded view of an embodiment of a portable electronic device according to the invention from another point of view.

Referring to FIG. 1 and FIG. 2 in combination with FIG. 3 and FIG. 4, an embodiment of a portable electronic device of the invention includes a main body 10, a side cover 20, a decorative plate 30, and an elastic element 40. The side cover 20 is pivotally disposed on the main body 10. The decorative plate 30 is pivotally disposed between the main body 10 and the side cover 20. The elastic element 40 is disposed between the decorative plate 30 and the side cover 20.

The side cover 20 is movable or rotatable between a first position and a second position relative to the main body 10. When in the first position, the side cover 20 abuts against the main body 10 and presses the decorative plate 30 and the elastic element 40, so that the decorative plate 30 horizontally lies and abuts between the main body 10 and the side cover 20. When in the second position, an angle exists between the side cover 20 and the main body 10, and the elastic element 40 pushes the decorative plate 30, so that the decorative plate 30 is erected and kept connected between the side cover 20 and the main body 10. In this way, the decorative plate 30 stably supports the side cover 20 in the second position, and fills up the space between the main body 10 and the side cover 20 for an aesthetic design.

Referring to FIG. 3 and FIG. 4, in an embodiment, the main body 10 is a portable hard disk, a portable optical disc drive, an electronic dictionary, an e-book, a hand-held palmtop computer (PC), an ultra-mobile personal computer (UMPC), a tablet computer, a digital still camera (DSC), a digital video camera (DV), a game console, a Global Positioning System (GPS), or a mobile communications device. The main body 10 includes a first housing 11 and a second housing 12. The first housing 11 includes a first inner surface 111 and a first outer surface 112 opposite to each other, and the second housing 12 includes a second inner surface 121 and a second outer surface 122 opposite to each other. The first housing 11 and the second housing 12 are docked and locked in a direction in which the first inner surface 111 faces the second inner surface 112. After the first housing 11 and the second housing 12 are docked, an internal space is formed between the first inner surface 111 and the second inner surface 112.

Further, referring to FIG. 3 and FIG. 4, a side of the first inner surface 111 of the first housing 11 includes a plurality of first pivot columns 113 and a plurality of first holes 114. The first pivot columns 113 are disposed at intervals, and the first holes 114 are provided at intervals. Each first hole 114 is adjacent to each first pivot column 113. In addition, a side of the second inner surface 121 of the second housing 12 includes a plurality of second pivot columns 123 and a plurality of second holes 124. The second pivot columns 123 are disposed at intervals, and the second holes 124 are disposed at intervals. Each second hole 124 is adjacent to each second pivot column 123.

The main body 10 is pivotally connected to the side cover 20 by means of the first housing 11 or pivotally connected to the side cover 20 by means of the second housing 12, or is pivotally connected to the side cover 20 by means of both the first housing 11 and the second housing 12. In an embodiment, referring to FIG. 3 and FIG. 4, the side cover 20 includes a first side cover 21 and a second side cover 22. The first side cover 21 is pivotally connected to the first housing 11, and the second side cover 22 is pivotally connected to the second housing 12.

Further, referring to FIG. 3 and FIG. 4, the first side cover 21 includes a first side-cover inner surface 211 and a first side-cover outer surface 212. A side of the first side-cover inner surface 211 includes a plurality of first pivotal connecting pieces 213. Each first pivotal connecting piece 213 of the first side cover 21 extends into the first hole 114 of the first housing 11 to pivotally connect to the first pivot column 113. The second side cover 22 includes a second side-cover inner surface 221 and a second side-cover outer surface 222. A side of the second side-cover inner surface 221 includes a plurality of second pivotal connecting pieces 223. Each second pivotal connecting piece 223 of the second side cover 22 extends into the second hole 124 of the second housing 12 to pivotally connect to the second pivot column 123.

In this way, the first side cover 21 rotates relative to the main body 10 about the side thereof pivotally connected to the main body 10, and the open/closed state of the first side cover 21 is changed as the other side of the first side cover 21 moves towards or away from the main body 10. Similarly, the second side cover 22 rotates relative to the main body 10 about the side thereof pivotally connected to the main body 10, and the open/closed state of the second side cover 22 is changed as the other side of the second side cover 22 moves toward or away from the main body 10.

Further, referring to FIG. 5, FIG. 6, FIG. 10, and FIG. 11, to enable the side cover 20 to form a fixed angle of pivotal rotation relative to the main body 10, a first positioning portion 13 and a second positioning portion 14 are further disposed on the main body 1, so that the side cover 20 is disposed in the first position and the second position. A mating positioning portion is disposed on the side cover 20 dispose on the first positioning portion 13 and the second positioning portion 14.

Figure 6:
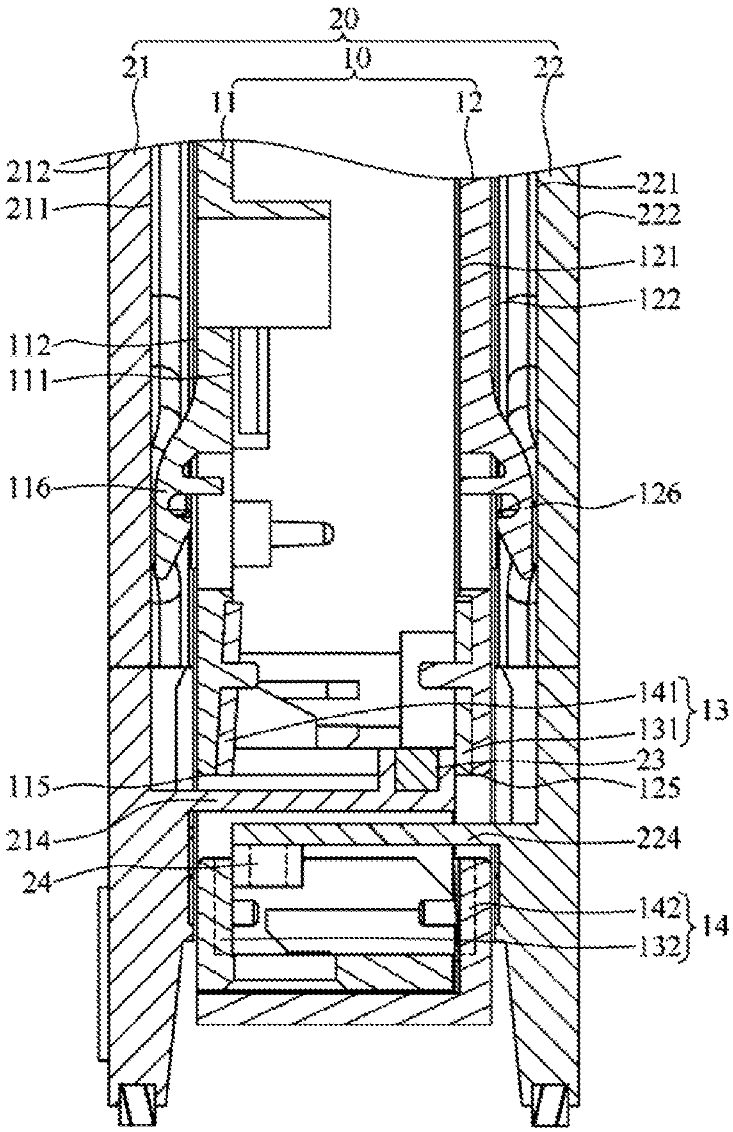
FIG. 6 is a partially enlarged view of FIG. 5.
Figure 11:
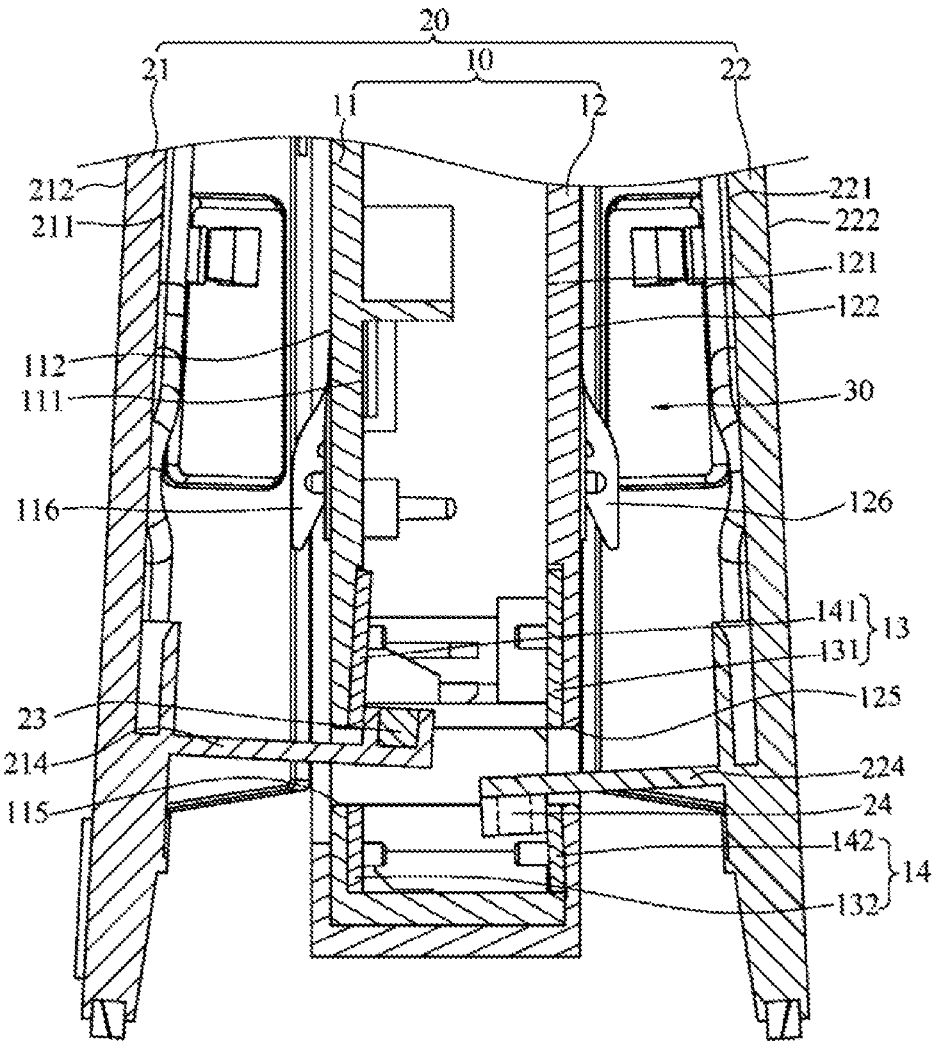
FIG. 11 is a partially enlarged view of FIG. 10.
Figure 12:
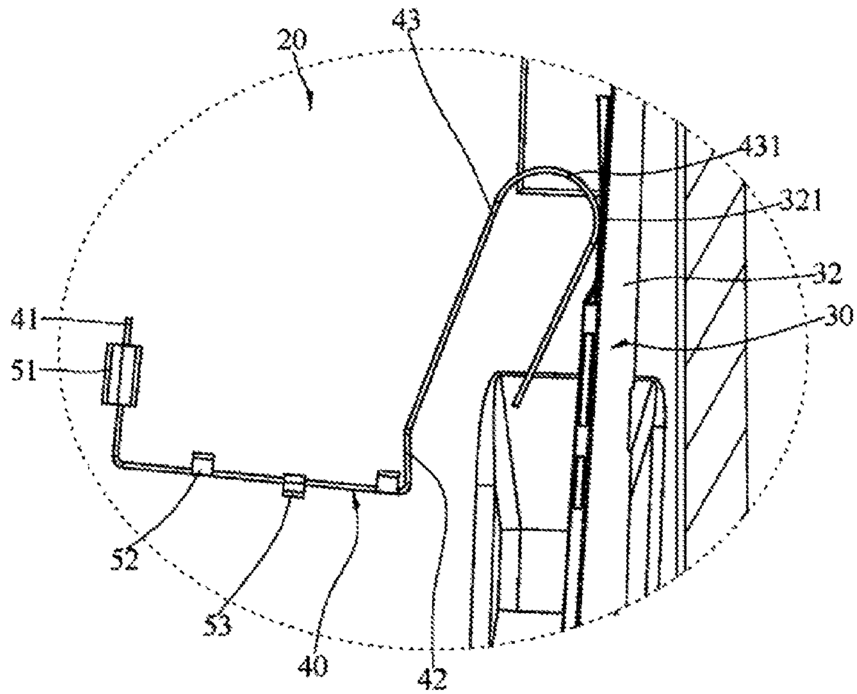
FIG. 12 is a schematic view illustrating a state of an elastic element in an embodiment of a portable electronic device in a second position according to the invention.
Figure 13:
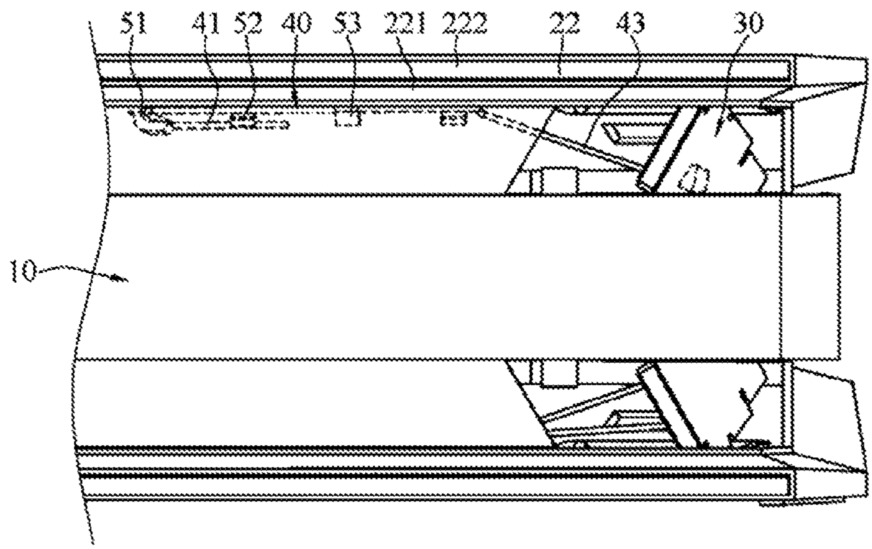
FIG. 13 is another schematic partial structural view of an embodiment of a portable electronic device in a second position according to the invention.

Further, referring to FIG. 6 and FIG. 11, the main body 10 includes an opening groove in communication with the internal space. The first positioning portion 13 and the second positioning portion 14 are disposed in the internal space of the main body 10. The side cover 20 includes a fin. The mating positioning portion of the side cover 20 is located on the fin. The fin of the side cover 20 extends from the opening groove into the internal space of the main body 10 to dispose on the first positioning portion 13 or the second positioning portion 14.

In an embodiment, further referring to FIG. 6 in combination with FIG. 3 and FIG. 4, the first housing 11 of the main body 10 includes a first opening groove 115. The first opening groove 115 runs through the first housing 11. The second housing 12 includes a second opening groove 125. The second opening groove 125 runs through the second housing 12. The position of the first opening groove 115 is opposite to that of the second opening groove 125. The first positioning portion 13 of the main body 10 includes a first magnetic piece 131 and a second magnetic piece 132. The first magnetic piece 131 is disposed on the second inner surface 121 and is located on a side of the opening groove 125 close to the second pivotal connecting piece 223. The magnetic piece 132 is disposed on the first inner surface 111 and is located on a side of the opening groove 115 away from the first pivotal connecting piece 213.

Similarly, referring to FIG. 6 in combination with FIG. 3 and FIG. 4, the second positioning portion 14 includes a third magnetic piece 141 and a fourth magnetic piece 142. The third magnetic piece 141 is disposed on the first inner surface 111 and is located on a side of the opening groove 115 close to the first pivotal connecting piece 213, and the fourth magnetic piece 142 is disposed on the second inner surface 121 and is located on a side of the opening groove 125 away from the second pivotal connecting piece 223.

Referring to FIG. 3 and FIG. 4, in an embodiment, the fin includes a first fin 214 and a second fin 224. The first fin 214 is located on the other side of the first side-cover inner surface 211 of the first side cover 21. An angle exists between the first fin 214 and the first side-cover inner surface 211. The first fin 214 is perpendicular or at other angles to the first side-cover inner surface 211.

In addition, the second fin 224 is located on the other side of the second side-cover inner surface 221 of the second side cover 22. An angle exists between the second fin 224 and the second side-cover inner surface 221. The second fin 214 is perpendicular or at other angles to the second side-cover inner surface 221. The first fin 214 of the first side cover 21 extends from the first opening groove 115 into the main body 10. The second fin 224 of the second side cover 22 extends from the second opening groove 125 into the main body 10. In this way, when the first side cover 21 rotates relative to the first housing 11 of the main body 10, the first fin 214 displaces in the first opening groove 115. When the second side cover 22 rotates relative to the second housing 12 of the main body 10, the second fin 224 displaces in the second opening groove 125.

Further, in an embodiment, still referring to FIG. 6 in combination with FIG. 3 and FIG. 4, the mating positioning portion includes a first mating positioning portion 23 and a second mating positioning portion 24. The first mating positioning portion 23 is disposed on the first fin 214 and protrudes towards a side close to the first pivotal connecting piece 213. The second mating positioning portion 24 is disposed on the second fin 224 and protrudes towards a side away from the second pivotal connecting piece 223. The first mating positioning portion 23 and the second mating positioning portion 24 are magnets that magnetically attract the first positioning portion 13 and the second positioning portion 14 for positioning.

Definitely, the form of engagement between the first and second positioning portions 13 and 14 and the first and second mating positioning portions 23 and 24 for positioning is not limited to magnetic attraction. In another feasible embodiment, the first and second positioning portions 13 and 14 and the first and second mating positioning portions 23 and 24 are configured into structures capable of being buckled to each other for positioning.

In foregoing embodiment where magnetic attraction is employed for positioning, when a user intends to change the position of the side cover 20, for example, change the side cover 20 from the first position to the second position, the side cover 20 moves towards the second position while the user applies a force to cause the side cover 20 to leave the first position. In this way, the side cover 20 is drawn to the second position by magnetic attraction, thus quickly changing the side cover 20 into a state in another position, and vice versa. Hence, this embodiment provides great convenience for usage.

Figure 5:
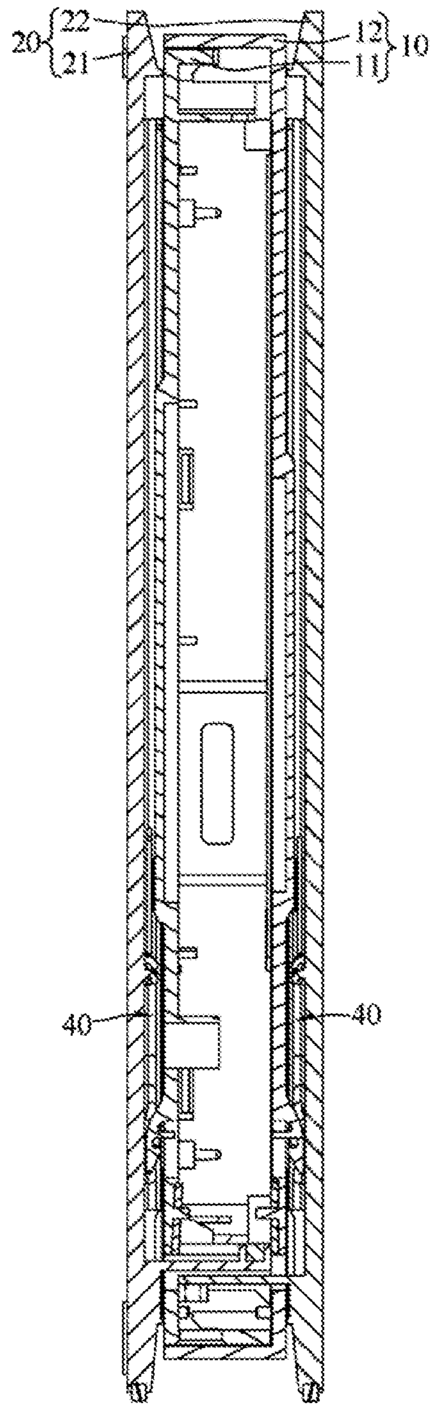
FIG. 5 is a cross-sectional view of an embodiment of a portable electronic device taken along line 5-5 in FIG. 1 according to the invention.

Thereby, referring to FIG. 5 and FIG. 6, when the first side cover 21 is in the first position with the other side thereof abutting against the main body 10, the first fin 214 of the first side cover 21 extends into the main body 10 and is close to the first magnetic piece 131, and the first mating positioning portion 23 on the first fin 214 is attracted by the first magnetic piece 131 to dispose in the first position. Similarly, the second fin 224 of the second side cover 22 extends into the main body 10 and is close to the second magnetic piece 132, and the second mating positioning portion 24 on the second fin 224 is attracted by the second magnetic piece 132 to dispose in the second position. In this case, the first side-cover inner surface 211 abuts against the first outer surface 112, the second side-cover inner surface 221 abuts against the second outer surface 122, the first side cover 21 is approximately parallel to the first outer surface 112, and the second side cover 22 is approximately parallel to the second outer surface 122, thereby minimizing the overall volume for ease of carrying or storage.

In addition, in an embodiment, referring to FIG. 6, the first mating positioning portion 23, the first magnetic piece 131, and the third magnetic piece 141 are all located on a side of the first opening groove 115 or the second opening groove 125 close to the side of the main body 10 pivotally connected to the side cover 20, and the second mating positioning portion 24, the second magnetic piece 132, and the fourth magnetic piece 142 are all located on a side of the first opening groove 115 or the second opening groove 125 away from the side of the main body 10 pivotally connected to the side cover 20. The position of the first opening groove 115 is opposite to that of the second opening groove 125.

Based on the above, although the first fin 214 and the second fin 224 of the first side cover 21 and the second side cover 22 extends into the body 10 through the first opening groove 115 and the second opening groove 125 opposite to each other, the first fin 214 and the second fin 224 are respectively disposed at positions on two opposite sides of the first opening groove 115 and the second opening groove 125 during positioning. Thereby, after extending into the main body 10, the first fin 214 and the second fin 224 present a vertically staggered and overlapping configuration. In this way, the thickness of the main body 10 does not need to increase due to the extension of the first fin 214 and the second fin 224, but can be reduced as much as possible, to achieve a lightweight and thin structure.

Figure 10:
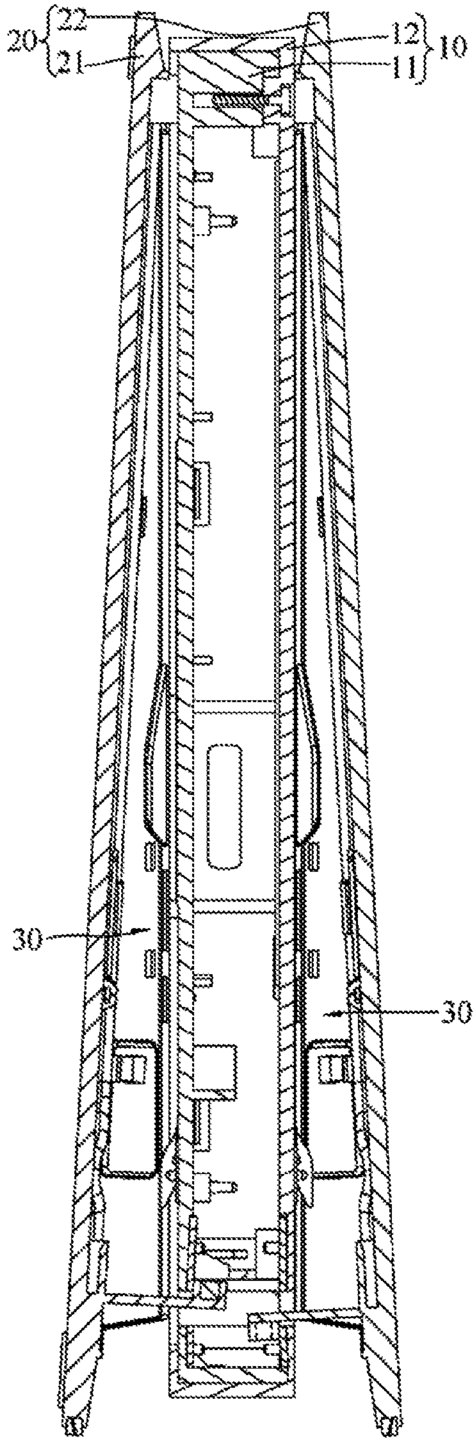
FIG. 10 is a cross-sectional view of an embodiment of a portable electronic device taken along line 10-10 in FIG. 1 according to the invention.

On the other hand, referring to FIG. 10 and FIG. 11, when the other side of the first side cover 21 is away from the main body 10 to present the open state, that is, in the second position, the first fin 214 of the first side cover 21 displaces from the first opening groove 115 to outside of the main body 10, and the first mating positioning portion 23 on the first fin 214 is attracted by the third magnetic piece 141 to dispose in the second position. Similarly, the second fin 224 of the second side cover 22 displaces from the second opening groove 125 to outside of the main body 10, and the second mating positioning portion 24 on the second fin 224 is attracted by the fourth magnetic piece 142 to dispose in the second position. In this case, an angle exists between the first side cover 21 and the first housing 11 of the main body 10, an angle exists between the second side cover 22 and the second housing 12 of the main body 10, and the first side cover 21 and the second side cover 22 are opened on two sides of the main body 10 to support the main body 10, so that the main body 10 is vertically placed for use.

It should be noted that being vertically placed for use means that when the main body 10 is placed on a plane, with a direction perpendicular to the plane being a height direction and a direction perpendicular to the height direction being a width direction or a length direction, it is considered that the main body 10 is vertically placed if the height of the main body 10 is greater than the width or the length. Referring to FIG. 10 and FIG. 11, when the first side cover 21 or the second side cover 22 is opened, the first side cover 21 or the second side cover 22 is opened towards the width direction or the length direction. The use of either or both of the first side cover 21 and the second side cover 22 to support the main body in the width direction or the length direction improves the stability of vertical placement.

Further referring to FIG. 6 and FIG. 11, the first mating positioning portion 23 and the second mating positioning portion 24 respectively protrude from the first fin 214 and the second fin 224. Therefore, when the first side cover 21 and the second side cover 22 are in the first position, the first mating positioning portion 23 and the second mating positioning portion 24 are not only attracted by the first magnetic piece 131 and the second magnetic piece 132 through magnetic attraction force for positioning, but also are respectively located on inner sides of the second inner surface 121 and the first inner surface 111, and therefore will not detach from the second opening groove 125 or the first opening groove 115.

In addition, when the first side cover 21 and the second side cover 22 are in the second position, the first mating positioning portion 23 and the second mating positioning portion 24 are not only attracted by the third magnetic piece 141 and the fourth magnetic piece 142 through magnetic attraction force for positioning, but also are respectively located on inner sides of the first inner surface 111 and the second inner surface 121, and therefore will not detach from the first opening groove 115 or the second opening groove 125. In this way, both the first side cover 21 and the second side cover 22 are stably disposed at predetermined positions when in the first position or the second position.

Further, to enable the first side cover 21 and the second side cover 22 to be accurately at predetermined positions relative to the body 10, the first housing 11 of the body 10 further includes a first abutting portion 116. The first abutting portion is located between the first pivot column 113 and the first opening groove 115 and protrudes towards the first side cover 21. In addition, the second housing 12 further includes a second abutting portion 126. The second abutting portion 126 is located between the second pivot column 123 and the second opening groove 125 and protrudes towards the second side cover 22.

When the first side cover 21 is in the first position herein, the first side-cover inner surface 211 abuts against the first abutting portion 116, so that the first side cover 21 remains in a state of being parallel to the first housing 11. When the second side cover 22 is in the first position, the second side-cover inner surface 221 abuts against the second abutting portion 126, so that the second side cover 22 remains in a state of being parallel to the second housing 12. In this way, the entire structure presents a stable rectangular appearance, allowing for stable horizontal placement.

The first abutting portion 116 and the second abutting portion 126 are integrally formed with or otherwise coupled to the first side cover 21 or the second side cover 22. In an embodiment, the first abutting portion 116 is directly integrally formed by, but not limited to, stamping from the first side cover 21, and the second abutting portion 126 is integrally formed by, but not limited to, stamping from the second side cover 22.

Figure 7:
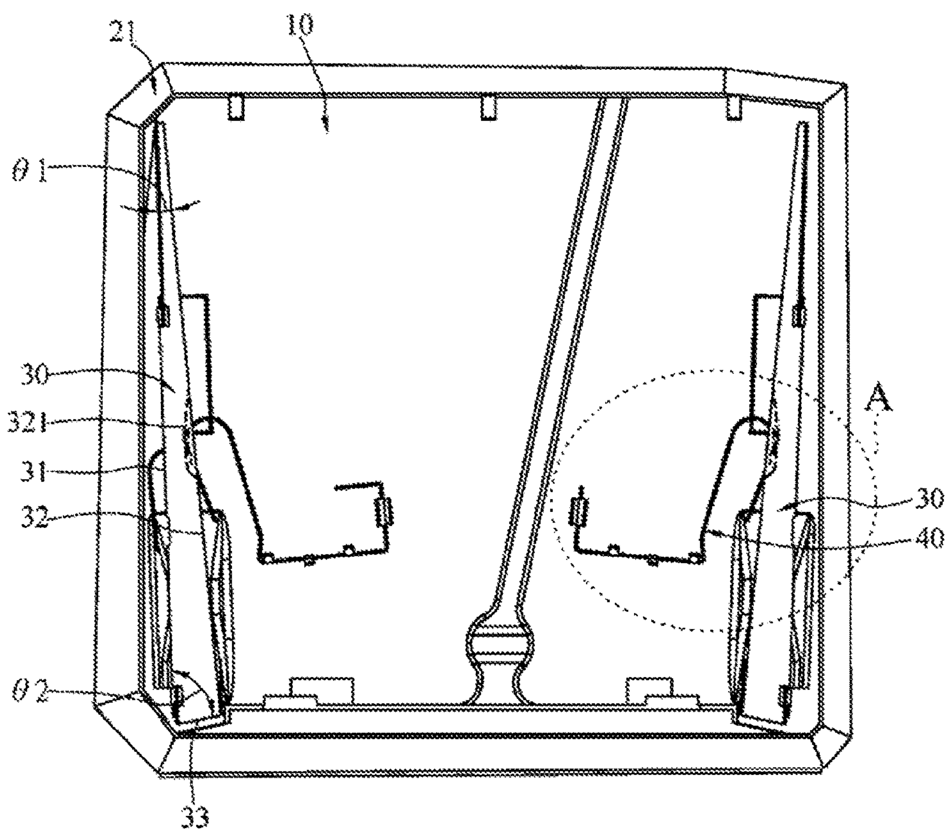
FIG. 7 is a planar assembled view of local components in an embodiment of a portable electronic device according to the invention.

Next, referring to FIG. 7, a plurality of decorative plates 30 is included. Each decorative plate 30 includes a first edge 31, a second edge 32, and a third edge 33. A first angle θ1 exists between the first edge 31 and the second edge 32. A second angle θ2 exists between the second edge 32 and the third edge 33. The second angle θ2 is greater than the first angle θ1. The first edge 32 of the decorative plate 30 is pivotally connected to the side cover 20. The second edge 32 slidably abuts against the main body 10. The third edge 33 abuts against the main body 10 or is supported between the main body 10 and the side cover 20 depending on the state of the side cover 20.

In addition, in an embodiment, referring to FIG. 7, in the decorative plate 30, the connection between the first edge 31 and the second edge 32 faces a side of the side cover 20 pivotally connected to the main body 10, and the connection between the second edge 32 and the third edge 33 faces the other side of the side cover 20 pivotally connected to the main body 10. In this way, in the second position, that is, when a side of the side cover 20 is pivotally connected to the main body 10 and the other side pivotally rotates to be opened to form an approximately triangular gap between the main body 10 and the side cover 20, the decorative plate 30 is able to fill up the triangular gap to achieve an optimal visual decoration effect. In addition to providing the visual decoration effect, the decorative plate 30 kept connected between the main body 10 and the side cover 20 further supports the side cover 20 when the side cover 20 is opened relative to the main body 10, so that when the main body 10 is vertically placed by means of the opened side cover 20, the side cover 20 provides a more stable supporting force, thereby improving the stability of the main body 10 when vertically placed.

In an embodiment, referring to FIG. 3 and FIG. 4 again, two decorative plates 30 are disposed for the first side cover 21, and the two decorative plates 30 on the first side cover 21 are located on two opposite sides between the first pivot column 113 and the first opening groove 115. Two decorative plates 30 are disposed on the second side cover 22, and the two decorative plates 30 on the second side cover 22 are located on two opposite sides between the second pivot column 123 and the second opening groove 125.

Figure 8:
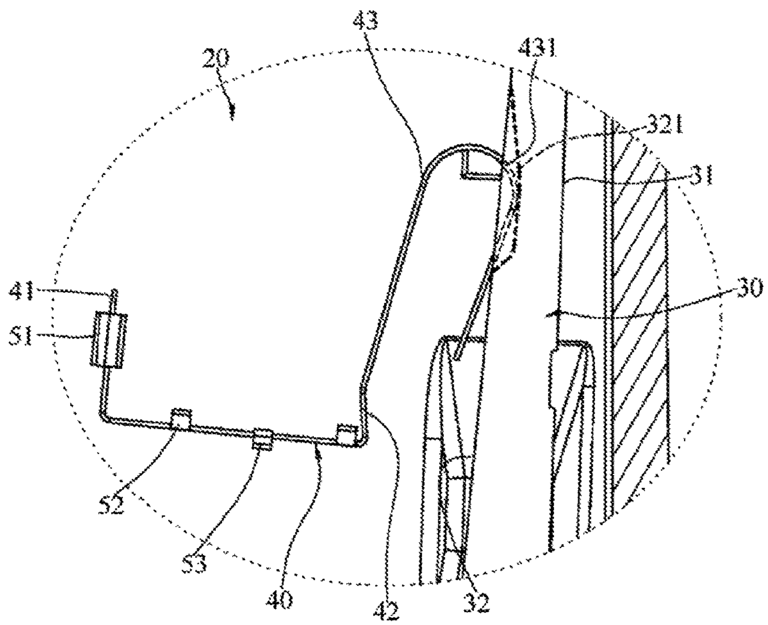
FIG. 8 is a partially enlarged view of a circled part 8 in FIG. 7.
Figure 9:
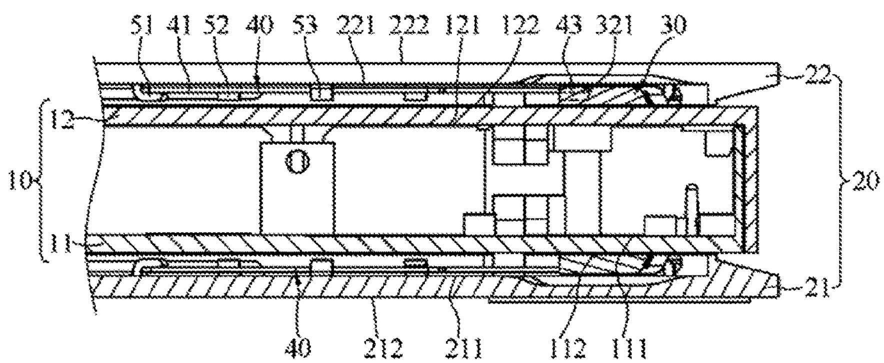
FIG. 9 is a cross-sectional view of an embodiment of a portable electronic device taken along line 9-9 in FIG. 1 according to the invention.

Referring to FIG. 3 and FIG. 4 in combination with FIG. 8 and FIG. 9, an elastic element 40 is disposed between each decorative plate 30 and the side cover 20. The elastic element 40 is located between the side cover 20 and the main body 10 and elastically presses against the decorative plate 30 in a normal state, so that the decorative plate 30 normally provides a force of pressing between the main body 10 and the side cover 20 by means of the third edge 33. In an embodiment, the second edge 32 of the decorative plate 30 further includes an abutting groove 321, and the elastic element 40 abuts against the abutting groove 321 to apply a force to the decorative plate 30.

The elastic element 40 is a linear spring, but the invention is not limited thereto. An elastic restoring force of the elastic element 40 in this embodiment is less than a magnetic attraction force of each magnetic piece. Therefore, when the side cover 20 is in the first position, the decorative plate 30 is pressed by the side cover 20, accumulates an elastic force, and is able to keep abutting against the side cover 20 and the main body 10. When the side cover 20 is in the second position, the force applied by the side cover 20 to press the decorative plate 30 is released, and the elastic element 40 is elastically reset to press against the decorative plate 30, so that the decorative plate 30 is automatically reset to be supported between the main body 10 and the side cover 20.

Referring to FIG. 7 and FIG. 8, in an embodiment, the elastic element 40 includes a fixed segment 41, a connection segment 42, and an abutting segment 43 sequentially connected. In the normal state, the abutting segment 43 is not coplanar with the fixed segment 41. The abutting segment 43 includes an abutting portion 431. The abutting portion 431 is of an arc structure. The abutting portion 431 of the elastic element 40 abuts against the abutting groove 321 of the decorative plate 30. The abutting segment 43 elastically pivotally swings relative to the fixed segment 41 about the connection segment 42. The fixed segment 41 in this embodiment is an L-shaped rod extending towards two different directions, but the invention is not limited thereto.

Referring to FIG. 3 and FIG. 4 in combination with FIG. 7 and FIG. 8, to ensure the operation of the elastic element 40, a positioning unit 50 is further disposed on the side cover 20 to position the fixed segment 41 of the elastic element 40. The positioning unit 50 includes a first clamping portion 51, a second clamping portion 52, and a third clamping portion 53. The first clamping portion 51 includes a first clamp 511, the second clamping portion 52 includes a second clamp 521, and the third clamping portion 53 includes a third clamp 531. Opening directions of the first clamp 511, the second clamp 521, and the third clamp 531 are different from each other.

Still referring to FIG. 3, FIG. 4, FIG. 7, and FIG. 8, two positioning units 50 are disposed on each of the first side-cover inner surface 211 of the first side cover 21 and the second side-cover inner surface 221 of the second side cover 22. The fixed segment 41 of each elastic element 40 is clamped in the first clamp 511, the second clamp 521, and the third clamp 531. In this way, the fixed segment 41 of the elastic element 40 is stably clamped to ensure that the fixed segment 41 cannot be easily displaced or rotated, and to further ensure that the abutting segment 43 is able to pivotally swing depending on a force applied thereto.

In this way, referring to FIG. 9, when the side cover 20 is changed from the second position to the first position, the force applied by the side cover 20 to press the elastic element 40 causes the abutting segment 43 of the elastic element 40 to pivotally swing relative to the fixed segment 41 and to be pressed to be coplanar with the fixed segment 41, so that the decorative plate 30 presents a flat form abutting against the main body 10 and the side cover 20.

Referring to FIG. 10, FIG. 11, FIG. 12, and FIG. 13, when the side cover 20 is changed from the first position to the second position, the force applied by the side cover 20 to press the elastic element 40 disappears, and the abutting segment 43 of the elastic element 40 is elastically reset to pivotally swing relative to the fixed segment 41 and apply a force to the abutting groove 321 to hold up the decorative plate 30, so that the decorative plate 30 is supported between the main body 10 and the side cover 20. When the side cover 20 is changed from the first position to the second position, the decorative plate 30 is automatically opened to fill up the space between the side cover 20 and the main body 10 and provide a supporting force. When the side cover 20 is changed from the second position to the first position, the decorative plate 30 is received together with the side cover 20 without affecting storage.

Figure 14:
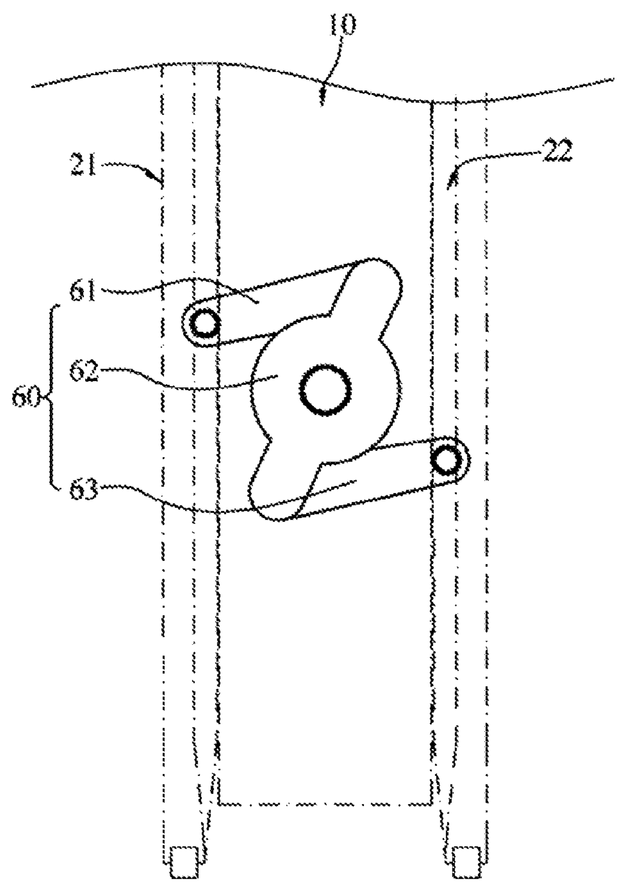
FIG. 14 is a schematic view illustrating a state of a linkage apparatus disposed between two side covers in an embodiment of a portable electronic device in a first position according to the invention.
Figure 15:
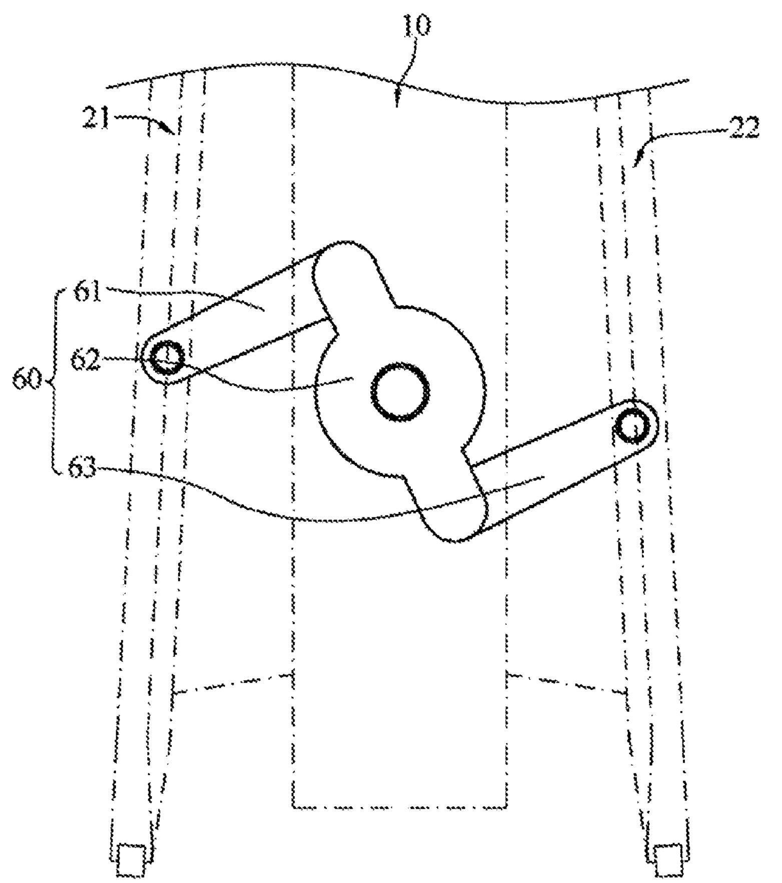
FIG. 15 is a schematic view illustrating a state of a linkage apparatus disposed between two side covers in an embodiment of a portable electronic device in a second position according to the invention.

In another embodiment, as shown in FIG. 14 and FIG. 15, after the main body 10 is pivotally connected to the side covers 20 through the two sides thereof, a linkage apparatus 60 is further disposed between the two side covers 20. The two side covers 20 are adapted to be synchronously closed through linkage of the linkage apparatus 60. The linkage apparatus 60 includes a first segment 61, a joint 62, and a second segment 63. The first segment 61 and the second segment 63 are respectively pivotally connected to the joint 62. The first segment 61 is further pivotally connected to the first side cover 21. The second segment 63 is further pivotally connected to the second side cover 22. In this way, when the user changes the position of the first side cover 21 or the second side cover 22, the two side covers 20 are synchronously displaced by means of the linkage apparatus 60, to provide another use mode.

In conclusion, in the disclosure, the two sides of the main body 10 are pivotally connected to the side covers 20, and the side covers 20 are movable relative to the main body 10 to dispose in the first position and the second position. In this way, the side cover 20 is expanded at a side edge of the main body 10 to support the main body 10, so that the main body 10 is vertically placed to reduce space occupied by the main body 10. In addition, the decorative plate 30 is further disposed between the side cover 20 and the main body 10 and is opened or retracted along with the action of the side cover 20, to decorate the gap space and provide a supporting force when the side cover 20 is opened and to be automatically retracted when the side cover 20 is closed, allowing for intuitive and convenient usage.

Although the invention is disclosed above by using embodiments, the embodiments are not intended to limit the invention. Any person of ordinary skill in the art can make some modifications or changes without departing from the spirit and scope of the invention. Therefore, the invention covers the modifications and changes provided that the modifications and changes fall within the claims and a scope equivalent to the claims.

What is claimed is:

1. A portable electronic device, comprising:

a main body;

a side cover, pivotally disposed on a side edge of the main body, wherein the side cover is movable between a first position and a second position relative to the main body, the side cover abuts against the main body when in the first position, and the side cover forms an angle with the main body when in the second position;

a decorative plate, comprising a first edge, a second edge, and a third edge, wherein the first edge is pivotally disposed on the side cover, the second edge abuts against the main body when the side cover is in the first position, and the third edge abuts against the main body when the side cover is in the second position; and an elastic element, disposed at the second edge, wherein the elastic element supports the decorative plate when the side cover is in the second position.

2. The portable electronic device according to claim 1, wherein the elastic element is a linear spring.

3. The portable electronic device according to claim 1, wherein the main body comprises a first positioning portion and a second positioning portion, the side cover comprises a mating positioning portion, and the mating positioning portion is disposed on the first positioning portion or the second positioning portion.

4. The portable electronic device according to claim 3, wherein the main body comprises an opening groove, the side cover comprises a fin, the mating positioning portion is located on the fin, and the fin of the side cover is adapted to extend into the opening groove.

5. The portable electronic device according to claim 3, wherein the first positioning portion and the second positioning portion are magnetic pieces.

6. The portable electronic device according to claim 1, wherein the elastic element comprises a fixed segment, a connection segment, and an abutting segment sequentially connected, the fixed segment is fixed on the side cover, and the abutting segment elastically pivotally swings relative to the fixed segment about the connection segment.

7. The portable electronic device according to claim 1, wherein the second edge of the decorative plate comprises an abutting groove, and the abutting segment abuts against the abutting groove.

8. The portable electronic device according to claim 1, wherein a first angle exists between the first edge and the second edge, a second angle exists between the second edge and the third edge, the second angle is greater than the first angle, and in the decorative plate, the position of the first angle faces a side of the side cover pivotally connected to the main body, and the position of the second angle faces the other side of the side cover pivotally connected to the main body.

9. The portable electronic device according to claim 1, wherein the portable electronic device comprises two side covers, the two side covers are respectively pivotally disposed on two opposite sides of the main body, and a linkage apparatus is disposed between the two side covers.

10. The portable electronic device according to claim 9, wherein the linkage apparatus comprises a first segment, a joint, and a second segment, the first segment and the second segment are pivotally connected to the joint, the first segment is further pivotally connected to one of the side covers, and the second segment is further pivotally connected to the other side cover.

* * * * *